United States Patent
Yanagawa et al.

(10) Patent No.: US 6,348,810 B1
(45) Date of Patent: Feb. 19, 2002

(54) INTERFACE UNIT FOR A TESTER AND METHOD OF CONNECTING A TESTER WITH A SEMICONDUCTOR DEVICE TO BE TESTED

(75) Inventors: Makoto Yanagawa, Kanagawa-ken; Yuji Wada, Saitama-ken; Keiji Muraju, Honjo, all of (JP)

(73) Assignee: Hitachi Electronics Engineering Co., Ltd. (JP)

( * ) Notice: Subject to any disclaimer, the term of this patent is extended or adjusted under 35 U.S.C. 154(b) by 0 days.

(21) Appl. No.: 09/382,618

(22) Filed: Aug. 25, 1999

(30) Foreign Application Priority Data

Sep. 8, 1998 (JP) ............................................. 10-253924

(51) Int. Cl.[7] .............................................. G01R 31/26
(52) U.S. Cl. ...................................................... 324/765
(58) Field of Search ................................ 324/765, 758, 324/158 P, 754, 149; 439/482, 68

(56) References Cited

U.S. PATENT DOCUMENTS 4,757,256 A * 7/1988 Whann et al. ............ 324/158 P
5,225,037 A * 7/1993 Elder et al. .................. 156/664
5,748,006 A * 5/1998 Sano ............................ 324/754
6,072,325 A * 6/2000 Sano ............................ 324/758

FOREIGN PATENT DOCUMENTS

JP          08139142         * 5/1996

* cited by examiner

Primary Examiner—Safet Metjahic
Assistant Examiner—Etienne P LeRoux
(74) Attorney, Agent, or Firm—Morrison & Foerster LLP

(57) ABSTRACT

Contact ring, which is brought into contact with a probe card having tungsten needles, has a multiplicity of POGO pins on its one surface facing the probe card. The contact ring has, on another surface opposite to the one surface, press-fitting sockets electrically connected with the POGO pins. Motherboard has sockets similar in construction to the press-fitting sockets of the contact ring. Coaxial cables each have press-fit terminals that are press-fittable in one of the sockets of the contact ring and in one of the sockets of the motherboard, and thereby these coaxial cables electrically connect the contact ring with the motherboard. Because the contact ring and the motherboard are electrically connected with each other by the press-fit engagement alone, there are encountered no inconveniences due to the conventional soldering-based connection.

8 Claims, 3 Drawing Sheets

INTERFACE UNIT FOR A TESTER AND METHOD OF CONNECTING A TESTER WITH A SEMICONDUCTOR DEVICE TO BE TESTED

BACKGROUND OF THE INVENTION

The present invention relates generally to interface units for testers that test electrical characteristics of IC (Integrated Circuit) devices and other semiconductor devices. More particularly, the present invention relates to a tester interface unit for providing electrical connection between a contact ring and a motherboard, and a method of connecting the tester with a semiconductor device to be tested.

In order to ship IC devices with performance and quality assurances as final products, it is generally necessary to extract some or all of the IC devices and examine predetermined electrical characteristics of the extracted devices in manufacturing and test stages. Normally, the electrical characteristics of the IC devices are examined by so-called IC testers. In many cases, the IC testers perform a probe test for examining IC devices formed on a semiconductor wafer prior to a final test step. For examination of the IC devices on the semiconductor wafer, a special test device called a "probe device (or probe card)" is required which connects the IC devices to the IC tester. Each of the ordinary-type probe devices operates in a so-called cantilever fashion. Namely, each of these probe devices has a plurality of tungsten needles manually soldered onto a printed circuit board and projecting obliquely from the printed circuit board, and the obliquely-projecting tungsten needles are resiliently pressed against bonding pads of the IC devices. Therefore, the number of the IC devices that can be examined simultaneously depends greatly on the technology for manufacturing the probe device.

In recent years, the number of IC devices capable of being examined simultaneously has been progressively increasing, such as 16, 32 and 64. As the number of IC devices capable of being examined simultaneously increases there arises a need to reliably connect signal lines corresponding to 1,000 to 3,000 pins between the probe device and the tester, not to mention a need for a technique of fixing the needles with high accuracy. The probe devices today generally include a signal-line-connecting area that is located off and around the outer periphery of a central needle-fixing area, and thus it has become extremely difficult to form, in that signal-line-connecting area, a wiring pattern for supplying electric signals to 3,000 or more pins. Further, because the wiring pattern is connected with the signal lines by soldering, there would arise the problems that gold-plated pads of the IC devices are smudged or stained by a flux used in the soldering and a leakage current is produced between the pins by the flux.

Japanese Patent Laid-open Publication No. HEI-8-139142 discloses using a POGO pin ring in the form of an annular board. The POGO pin ring disclosed in the publication has a large number of POGO pins on opposite surfaces thereof. The POGO pins on one of the two surfaces are electrically connected with those on the other surface in a one-to-one relation. The one surface of the POGO pin ring is brought into contact with a performance board associated with a test head while the other surface of the POGO pin ring is brought into contact with a probe card, so that an electrical connection is achieved between the test head and the probe card. In this case, the distance or interval between the test head and the probe card is fixedly defined by the thickness of the POGO pin ring, and thus the tester is unavoidably fixed in construction, which would result in poor operability of the tester.

SUMMARY OF THE INVENTION

It is therefore an object of the present invention to provide an interface unit for a tester which can effectively avoid inconveniences encountered in connecting signals lines regardless of an increase in the number of simultaneously-tested IC devices and thereby achieves highly-reliable connection between the signal lines.

In order to accomplish the above-mentioned object, the present invention provides an interface unit for a tester which comprises: a contact board having a large number of contact terminals provided on one surface thereof, and sockets provided on another surface thereof and electrically connected with the contact terminals; a motherboard having a large number of wires to be connected to the contact terminals of the contact board, and a large number of sockets electrically connected with the wires; and a large number of connecting cables each having two plugs provided at opposite ends thereof. The plug provided at one end of each of the connecting cables is removably inserted in one of the sockets of the contact board and the plug provided at another end of each of the connecting cables is removably inserted in one of the sockets of the motherboard, so that the connecting cables electrically connect the contact terminals of the contact board with the wires of the motherboard.

The tester interface unit is used for providing electrical connection between a test control section and a probe section of a tester for an IC or other semiconductor device. The wires of the motherboard are connected to the test control section and the contact terminals provided on the one surface of the contact board are placed in contact with contact terminals of the probe section. The probe section is a probe card having the above-mentioned contact terminals on one surface thereof and contact needles, such as tungsten needles, on the other surface thereof, and the contact terminals of this probe section are electrically connected with the contact needles. When performing a test, the contact needles of the probe section are placed in contact with predetermined terminals of the device to be tested such as a semiconductor wafer, semiconductor device or IC.

The contact board is a contact ring having an annular shape, and the contact terminals provided on its one surface facing the probe card are resiliently movable contact pins such as POGO pins. This contact ring has, on the other surface, press-fitting sockets electrically connected with the POGO pins. The motherboard also has sockets that are similar in construction to the press-fitting sockets of the contact ring. By press-fitting plugs at opposite ends of connecting cables in desired ones of the sockets of the contact board and motherboard, the contact terminals (POGO pins) of the contact ring and the contact terminals of the motherboard are electrically connected with each other. Because the contact ring and the motherboard are electrically connected with each other only by the press-fit engagement between the plugs and the sockets, there are encountered no inconveniences that would result from the conventional soldering-based connection. Such plugs and sockets are preferred in that they can be firmly press-fitted with each other with increased reliability. For examples, each of the connecting cables is a coaxial cable including mold terminal sections at opposite ends thereof, and each of the mold terminal sections has at least two plugs projecting therefrom. Although it is preferable that the contact terminals provided on the one surface of the contact board be POGO pins as noted above, any other contact terminals than the POGO pins may be employed.

BRIEF DESCRIPTION OF THE DRAWINGS

For better understanding of the object and other features of the present invention, its preferred embodiments will be described in greater detail hereinbelow with reference to the accompanying drawings, in which.

DETAILED DESCRIPTION OF THE PREFERRED EMBODIMENTS

Figure 2:
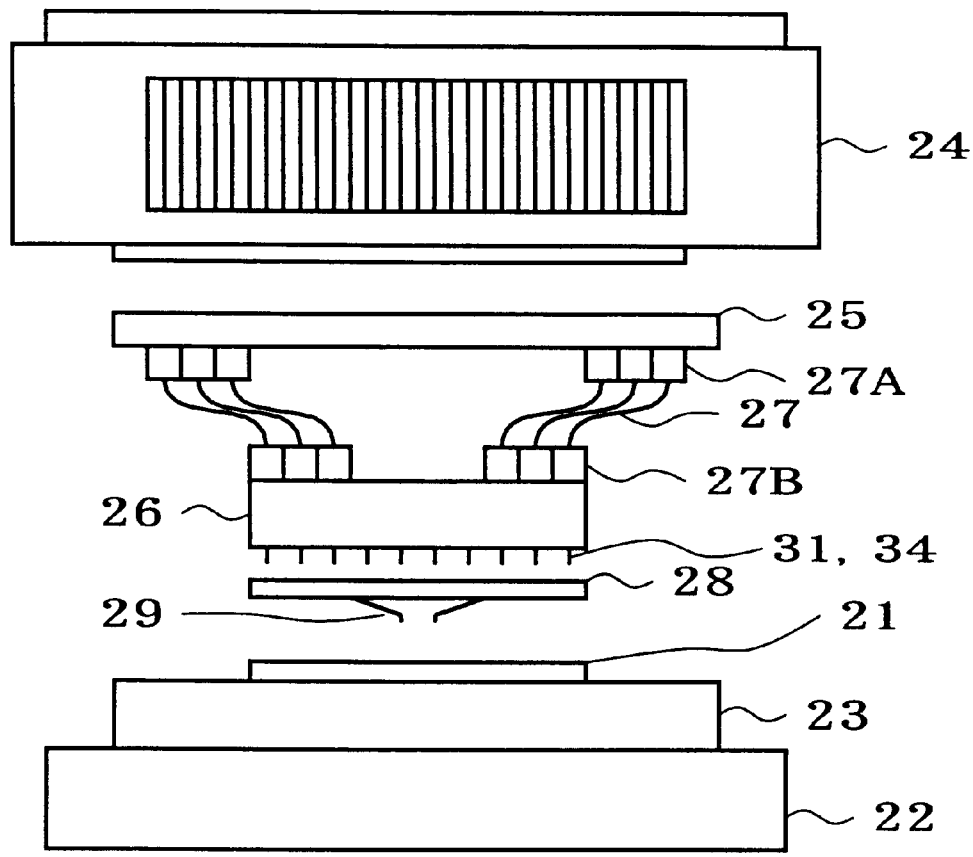
FIG. 2 is a diagram schematically showing a general hardware organization of an IC tester employing a probe device of the present invention.

FIG. 2 is a diagram schematically showing a general hardware organization of an IC tester employing an interface unit in accordance with a preferred embodiment of the present invention. Semiconductor wafer 21 includes a plurality of IC device chips formed thereon. XYZ stage 22 functions to position a tray 23, for placing thereon the semiconductor wafer 21, in three dimensions and rotate the wafer tray 23 about its Z axis.

Test station 24 determines a pin arrangement corresponding to a pin electronics card to be mounted, and this test station 24 is connected with an interface unit of a device to be tested (hereinafter "tested-device interface unit"). The tested-device interface unit includes a motherboard 25 and a plurality of coaxial cables 27. The motherboard 25 is in the form of a printed circuit board and is connected to the test station 24. The plurality of coaxial cables 27 electrically connect the motherboard 25 with a contact ring (or contact board) 26.

The contact ring 26 in this preferred embodiment has, on its one surface facing a probe card 28, groups of contact terminals 31, 34 commonly called POGO pins. Whereas the POGO pins in the conventionally-known probe devices are provided on opposite surfaces of the contact ring facing the probe card and motherboard, the POGO pins in the present invention are provided only on one surface of the contact ring facing the probe card. Specific constructions of the motherboard 25, coaxial cables 27 and contact ring 26 will be described later. The probe card 28, which is of the conventional construction, has a large number of tungsten needles 29 soldered thereon for contact with pads of the chips formed on the semiconductor wafer 21. Using the probe device of such a construction, a test signal is supplied to each of the chips on the semiconductor wafer 21 in order to examine predetermined electrical characteristics of the chip.

Figure 1:
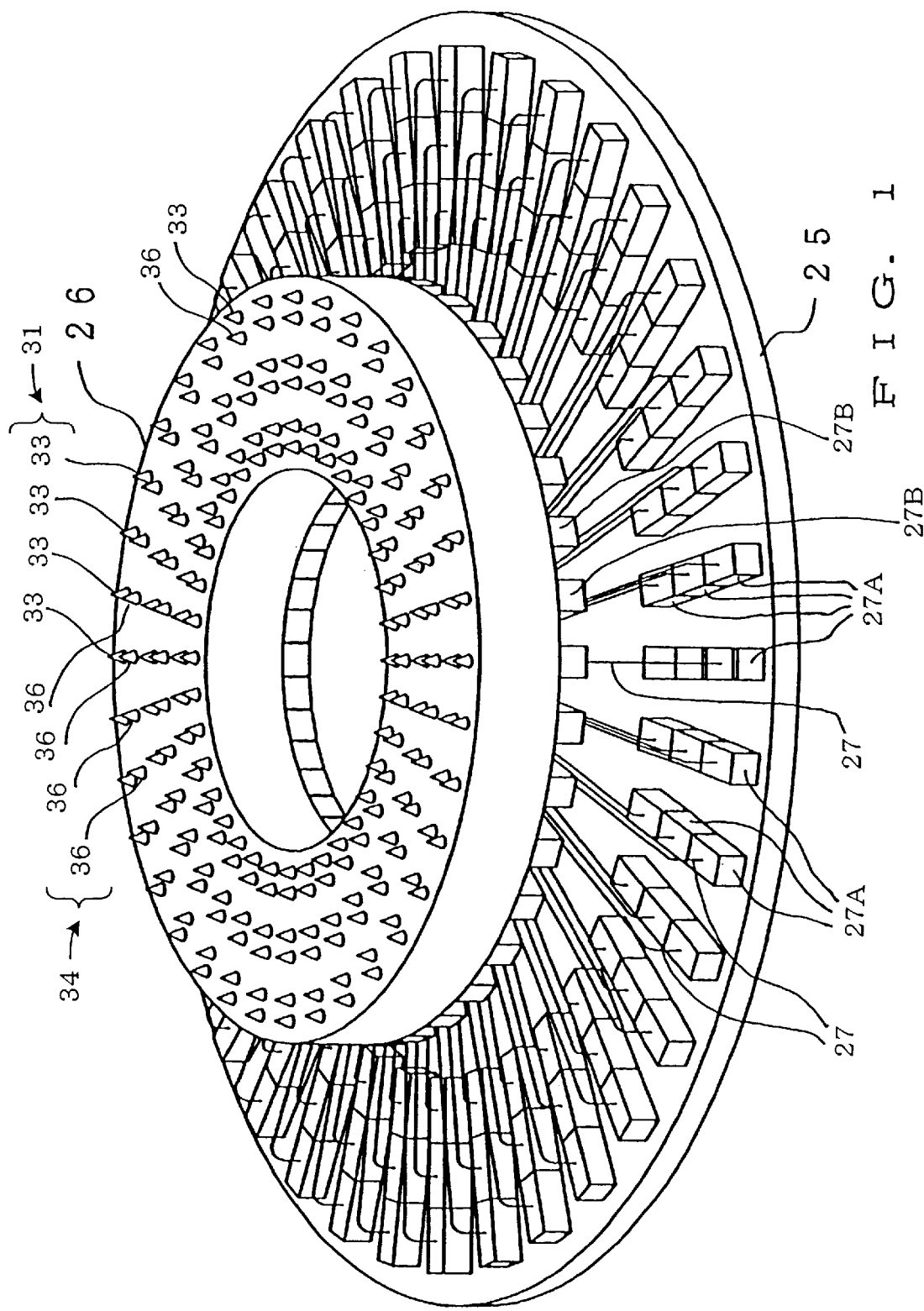
FIG. 1 is a perspective view showing specific constructions of a motherboard, coaxial cables and contact ring in a tester interface unit in accordance with a preferred embodiment of the present invention.
Figure 3:
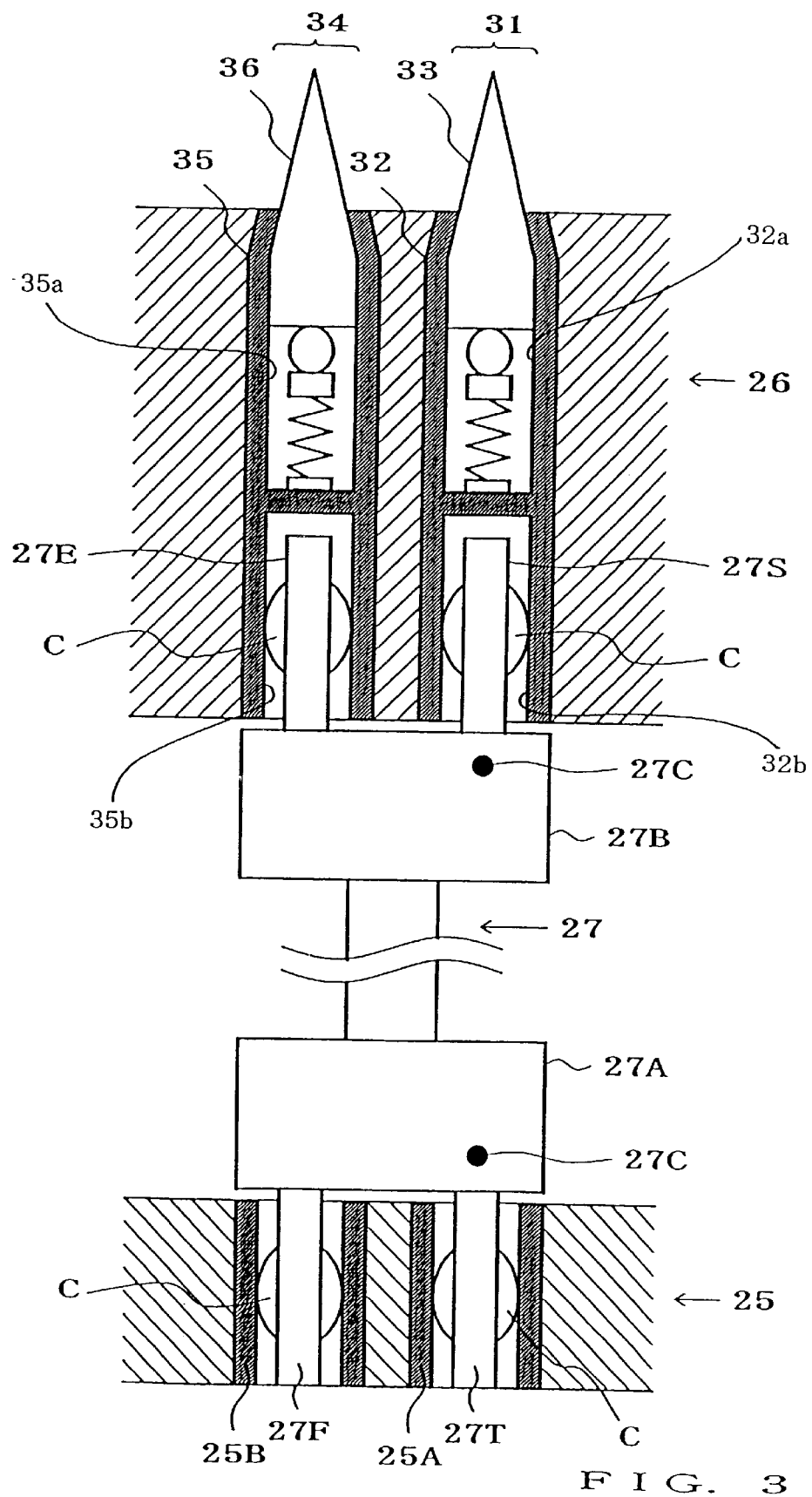
FIG. 3 is a sectional view showing details of a connection between the coaxial cable and the contact ring of FIG. 1 and a connection between the coaxial cable and the motherboard.

FIG. 1 is a perspective view showing specific constructions of the motherboard 25, coaxial cables 27 and contact ring 26. In FIG. 1, the motherboard 25, coaxial cables 27 and contact ring 26 are shown in opposite positional relationship to that of FIG. 2; that is, in FIG. 1, the contact ring 26 is shown as positioned above the coaxial cables 27 and the coaxial cables 27 above the motherboard 25. Further, FIG. 3 is a sectional view showing details of a connection between the coaxial cable 27 and the contact ring 26 of FIG. 1 and a connection between the coaxial cable 27 and the motherboard 25. As shown in FIG. 3, the contact ring 26 has a large number of the POGO pins only on its one surface facing the probe card 28.

The POGO pins 31 serve as signal contact terminals, while the POGO pins 34 serve as grounding contact terminals. Because the POGO pins 31 and 34 are identical to each other in construction, the POGO pins 31 will be described in detail below. Each of the POGO pins 31 includes an electrically conductive socket 32 having a cylindrical shape, whose interior is divided vertically into two interior portions 32a and 32b. Contact pin 33 is disposed within one of the two interior portions of the conductive socket 32 for vertical movement along the inner surface of the one or upper interior portion 32a. Only a tapered distal (upper) end portion of the contact pin 33 projects upwardly beyond the upper cylindrical interior space of the conductive socket 32. More specifically, the tapered distal end portion of the contact pin 33 projects upwardly through an opening of the conductive socket 32 that is smaller in diameter than the non-tapered body of the pin 33. Each of the contact pins 33 constituting the POGO pins may be constructed in any other way as long as the contact pin 33 is movable vertically within the interior portion of the conductive socket 32. Similarly, each of the other POGO pins 34 is constructed of an electrically-conductive socket 35 having two interior portions 35a and 35b and a contact pin 36. The motherboard 25 and the coaxial cables 27 are connected with each other via a large number of electrically-conductive sockets 25A and 25B each in the form of a through-hole in the motherboard 25.

Mold terminal sections 27A and 27B are provided at opposite ends of each of the coaxial cables 27. The mold terminal section 27B includes press-fit terminals 27S and 27E. The other mold terminal section 27A includes press-fit terminals 27T and 27F. The press-fit terminals 27S and 27T are connected to an inner conductor of the coaxial cable 27 within the mold terminal sections 27A and 27B, and similarly the press-fit terminals 27E and 27F are connected to an outer conductor of the coaxial cable 27 within the mold terminal sections 27A and 27B. On the outer surface of each of the mold terminal sections 27A and 27B, there is put a mark 27C indicating that the press-fit terminals 27S and 27T are terminals for signal lines. Each of the above-mentioned press-fit terminals 27S, 27E, 27T and 27F are each a pin-shaped plug provided with a resilient spring-like contact C.

As also shown in FIG. 3, the press-fit terminal 27S of the mold terminal section 27B is press-fitted in the other or lower cylindrical interior portion 32b of the conductive socket 32, and the press-fit terminal 27E of the mold terminal section 27B is press-fitted in the other or lower cylindrical interior portion 35b of the conductive socket 35. By the press-fit terminals 27S and 27E thus press-fitted in the lower cylindrical interior portions 3b and 35b of the conductive sockets 32 and 35, respectively, the above-mentioned, spring-like contacts C of the terminals 27S and 27E are firmly pressed against and electrically connected to the respective inner surfaces of the sockets 32 and 35. Similarly, the press-fit terminal 27T of the mold terminal sectiomn 27A is press-fitted in the through-hole of the conductive socket 25A and the press-fit terminal 27F of the mold terminal section 27A is press-fitted in the through-hole of the conductive socket 25B, so that the contacts C of the plugs 27T and 27F are pressed against and electrically connected to the respective inner surfaces of the sockets 25A and 25B.

FIG. 1 illustrates an example where there are provided a total of 216 POGO pins on one surface of the contact ring 26, six POGO pins in each radial row. Therefore, the mold terminal sections 27B of a total of 108 coaxial cables, three coaxial cables in each radial row, are press-fitted in the other surface of the contact ring 26 which is opposite to the one surface where the POGO pins are provided. The mold terminal sections 27A of the 108 coaxial cables are, on the other hand, press-fitted in the through-holes of the conductive sockets 25A and 25B that are provided in the motherboard 25 along its circumference greater in diameter than the contact ring 26. Because the coaxial cables 27, contact ring 26 and motherboard 25 are electrically connected with each other by press-fitting engagement with no soldering, reliability of the electrical connections can be greatly increased, which achieves high-density packaging. Besides, this press-fitting arrangement can eliminate the possibilities of the gold-plated pads being smudged or stained by a flux used in soldering and the flux producing a leakage current between the pins.

The example of FIG. 1 has been described as having 216 POGO pins; in practice, however, 1,000 to 3,000 or a greater number of POGO pins are electrically connected using the coaxial cables. Further, in the present invention, the contact ring 26 and the motherboard 25 are mechanically connected with each other by given coupling (not shown). Furthermore, in a situation where several of the coaxial cables 27 are used as power supply cables, these coaxial cables 27 may be used with their respective inner and outer conductors short-circuited.

The preferred embodiment of the present invention has been described above in relation to the case where two mold terminal sections having signal press-fit terminals and grounding press-fit terminals are provided for each of the coaxial cables. However, the present invention is not so limited, and mold terminal sections having N (which is an arbitrary positive integer) signal press-fit terminals and N grounding press-fit terminals may be provided for N coaxial cables. Alternatively, mold terminal sections having N signal press-fit terminals and N or more grounding press-fit terminals may be provided for N coaxial cables. Namely, where a plurality of the grounding POGO pins are to be provided around each of the signal press-fit terminal, it is only necessary that the mold terminal section be constructed to have the grounding press-fit terminals greater in number than the signal press-fit terminal. It should also be apparent that the spring-like contacts C may be provided on the sockets (32, 35, 25A, 25B) rather than on the plugs (terminals 27S, 27E, 27T, 27F).

Furthermore, whereas the present invention has been described above in relation to a probe tester for testing IC devices in the form of a semiconductor wafer, it should be apparent that the present invention is also applicable as an interface unit for providing electrical connection between the contact ring and the motherboard. Moreover, whereas the present invention has been described in relation to an IC tester, it can of course be applied to a package tester, logic tester and the like. Therefore, the contact ring employed in the present invention does not have to be always ring-shaped and may be a plate having any desired shape.

In summary, the tester interface unit in accordance with the present invention achieves highly-reliable connection between signal lines.

What is claimed is:

1. An interface unit for an IC tester, said interface unit contacting, via contact terminals, a probe device of the IC tester to thereby transmit test signals to the IC tester, said interface unit comprising:
    a contact board having a large number of said contact terminals provided on one surface of said contact board, and sockets provided on another surface of said contact board and electrically connected with said contact terminals, said sockets comprising a plurality of pairs of sockets, each of the pairs of sockets comprising a signal socket and a ground socket;
    a motherboard having conductors to be connected to the contact terminals of said contact board, and a large number of sockets electrically connected with said conductors, said sockets comprising a plurality of pairs of sockets, each of the pairs of sockets comprising a signal socket and a ground socket; and
    a large number of connecting cables each having a pair of plugs provided at opposite ends thereof, wherein each pair of the plugs provided at one of the ends of each of said connecting cables is removably inserted in each pair of the sockets of said contact board and each pair of the plugs provided at another of the ends of each of said connecting cables is removably inserted in each pair of the sockets of said motherboard, whereby said connecting cables electrically connect the contact terminals of said contact board with the conductors of said motherboard.

2. An interface unit as recited in claim 1 wherein said plugs and said sockets are press-fittable with each other.

3. An interface unit as recited in claim 1 wherein each of said connecting cables is a coaxial cable and each of said coaxial cables has mold terminal sections at opposite ends thereof, each of said mold terminal sections having at least two plugs projecting therefrom.

4. An interface unit as recited in claim 1 wherein the contact terminals provided on the one surface of said contact board are POGO pins.

5. An interface unit as recited in claim 1 wherein the contact terminals provided on the one surface of said contact board are contact pins supported resiliently for vertical movement within a predetermined range.

6. An interface unit as recited in claim 1 wherein said contact board has a shape of a ring.

7. An interface unit as recited in claim 1 which is used for providing electrical connection between a test control section and a probe section of a semiconductor tester, and wherein the conductors of said motherboard are connected to the test control section and the contact terminals provided on the one surface of said contact board are placed in contact with contact terminals of the probe section.

8. A method of electrically connecting a test control section and a probe section of a semiconductor tester for performing a test of a semiconductor device, said method comprising:
    a step of connecting, to said test control section, a motherboard having conductors, said motherboard having a large number of sockets electrically connected with the conductors, said sockets comprising a plurality of pairs of sockets, each of the pairs of sockets comprising a signal socket and a ground socket;
    a step of connecting a pair of connecting plugs provided at one end of each of a large number of connecting cables to each pair of the sockets of said motherboard;
    a step of connecting a pair of connecting plugs provided at another end of each of the connecting cables to a pair of sockets provided on one surface of a contact board, wherein said pair of sockets of said contact board is one of a plurality of pairs of sockets, each of the pairs of sockets comprising a signal socket and a ground socket, and said contact board having, on another surface, a large number of contact terminals electrically connected with the sockets provided on the one surface of said contact board;
    a step of placing the contact terminals provided on the other surface of said contact board in contact with contact terminals of said probe section; and
    a step of, after said test control section and said probe sections are electrically connected with each other via preceding said steps, placing a test probe of said probe section in contact with the semiconductor device to be tested and causing a predetermined test signal to be supplied from said test control section to said probe section.

* * * * *